United States Patent [19]

Miura et al.

[11] 4,403,030
[45] Sep. 6, 1983

[54] PHOTOSENSITIVE LITHOGRAPHIC PRINTING PLATE MATERIAL

[75] Inventors: Konoe Miura, Yokohama; Shin-ichi Tanaka; Hiroshi Kojima, both of Hasaki; Takeshi Tanaka, Hachioji; Osamu Matsushita, Mishima, all of Japan

[73] Assignees: Mitsubishi Chemical Industries Limited; Konishiroku Photo Industry Co., Ltd., both of Tokyo, Japan

[21] Appl. No.: 326,759

[22] Filed: Dec. 2, 1981

[30] Foreign Application Priority Data

Dec. 11, 1980 [JP] Japan .................... 55-175121

[51] Int. Cl.³ .................................... G03C 1/90
[52] U.S. Cl. ................................. 430/273; 430/166; 430/278; 430/279; 430/961; 430/530; 430/538; 430/531
[58] Field of Search ............... 430/273, 166, 538, 531, 430/530, 961, 278, 279; 162/138, 181.2

[56] References Cited

U.S. PATENT DOCUMENTS

| 3,203,805 | 8/1965 | Burg | 430/273 |
| 3,337,392 | 8/1967 | Carlson et al. | 162/138 |
| 3,484,340 | 12/1969 | Lewin | 162/181.2 |
| 4,329,420 | 5/1982 | Bopp | 430/961 |

FOREIGN PATENT DOCUMENTS

| 55-88062 | 3/1980 | Japan | 430/538 |
| 55-118041 | 10/1980 | Japan | 430/538 |

Primary Examiner—Won H. Louie, Jr.
Attorney, Agent, or Firm—Oblon, Fisher, Spivak, McClelland & Maier

[57] ABSTRACT

There is disclosed a photosensitive lithographic printing plate material comprising a photosensitive layer having a slip sheet laid on the surface thereof, said slip sheet comprising natural pulp, 5 to 50% by weight of polyolefinic synthetic pulp and 0.2 to 2.0% by weight of an alkali metal halide.

3 Claims, No Drawings

PHOTOSENSITIVE LITHOGRAPHIC PRINTING PLATE MATERIAL

BACKGROUND OF THE INVENTION

1. Field of the Invention

This invention relates to a photosensitive lithographic printing plate material.

More particularly, it relates to a photosensitive lithographic printing plate material comprising a photosensitive layer having a slip sheet laid on the surface thereof, said slip sheet providing the photosensitive lithographic printing plate with excellent cutting property, being readily removed from the plate after cutting and prior to use of the plate, preventing electrification of the plate which may be caused by removal of a slip sheet, and having good fast-contacting property in the manufacturing process.

2. Description of the Prior Art

Slip sheets for photosensitive printing plate were used originally for the purpose of protecting plate faces. However, since lithographic PS plates which comprises aluminum base plates have been widely used, such slip sheets are required to possess higher performance quality from the viewpoint of manufacture and use.

Thus, from the viewpoint of manufacturing photosensitive printing plate materials, slip sheets should satisfy the following performance requirements.

(1) Photosensitive printing plate materials are generally packaged in units of several tens of plate materials which are piled up. The package process includes the step of cutting such several tens of printing plate materials to a predetermined size with a trimming cutter. In this step, conventional slip sheets damage the edge of the cutter upon several times of cuttings. Once the edge is damaged, the cut area no longer becomes a mirror surface, but it becomes a jagged surface having so great ruggedness that makes further production of the printing plate practically inoperable.

Thus, there still remains an intense need for improvement in cutting properties of slip sheets in order to prolong the lifetime of cutting edge.

(2) With the spread of lithographic PS plate, automatic mass production systems have been employed to manufacture such plates. In these systems, in general, a slip sheet is laminated to the surface of each individual photosensitive printing plate material and the resulting laminate is conveyed, for example, on a belt conveyor and piled up.

On this occasion, the slip sheet must have an improved fast-contacting property for the purpose of preventing the slip sheet from shifting out of position or removing from the surface of the plate material. A particular means employed for this purpose is electrification of the laminate, for example, by means of corona discharge. In this treatment, it is necessary to attain adequate fast-contacting property.

Then, from the viewpoint of using photosensitive printing plate materials, slip sheets should meet the following performance requirements.

(3) While fast contact of a slip sheet with a plate material is required from the viewpoint of manufacture, a slip sheet having an excessively high fast-contacting property suffers from a disadvantage in that it cannot be readily peeled off prior to use of the photosensitive printing plate material. In such cases, if a strong force is exercised to peel off the slip sheet, the photosensitive layer of the plate material is damaged, which adversely affects image formation. Therefore, it is necessary to readily separate or release slip sheets from printing plate materials prior to use.

(4) Prior to use of photosensitive printing plates, the interposed slip sheets are removed. With prior art slip sheets, removal of slip sheets is accompanied by frictional electrification, which often causes an electric shock, resulting in a decrease in working efficiency.

Therefore, such static electrification of slip sheets must be prevented.

There is a need for a slip sheet satisfying all the above-mentioned requirements. However, such a slip sheet is not known.

Thus, with conventional slip sheets comprised of natural pulp, as previously mentioned, the edge of a cutter is damaged upon several times of cuttings. Synthetic resin-precoated or laminated slip sheets have poor release properties and cause significant generation of static electricity, although use of such slip sheets prolongs the lifetime of a cutting edge. Another slip sheet which has heretofore been developed comprises paper which contains a wax (Japanese Patent Laid-open (Kokai) No. 88062/1980) or a fatty acid or its salt (Japanese Patent Laid-open (Kokai) No. 118041/1980). However, improvement in cutting property of such slip sheet is still unsatisfactory and its antistatic and conveying properties are also insufficient.

SUMMARY OF THE INVENTION

In view of the above circumstances, we have earnestly investigated and found that excellent slip sheets for photosensitive lithographic printing plate materials which satisfy all the aforementioned requirements can be obtained by incorporating a polyolefinic synthetic pulp and an alkali metal halide in natural pulp, thereby accomplishing this invention.

Thus, in brief, the present invention resides in a photosensitive lithographic printing plate material comprising a photosensitive layer having a slip sheet laid on the surface thereof, said slip sheet comprising natural pulp, 5 to 50% by weight of polyolefinic synthetic pulp and 0.2 to 2% by weight of an alkali metal halide.

DETAILED DESCRIPTION OF THE PREFERRED EMBODIMENTS

The polyolefinic synthetic pulp which is used in the invention includes polyethylene pulp, polypropylene pulp and the like. Polyethylene pulp is preferable due to its ready availability. When the content of polyolefinic synthetic pulp exceeds 50%, the slip sheet does not meet the requirements from the viewpoint of use, i.e., release property and antistatic property while the requirements from the viewpoint of manufacture, i.e., cutting property and conveying property are satisfied. On the contrary, if the polyolefinic synthetic pulp is present in an amount of less than 5%, the slip sheet involves some problems with respect to cutting property and conveying property. In other words, the slip sheet damages the cutting edge, resulting in a reduced lifetime of the edge, and the slip sheet exhibits poor fast-contacting property even if it is electrified by corona discharge or the like, thereby causing shifting out of position of the slip sheet during conveyance. Therefore, in order to satisfy all the requirements for slip sheets, the content of the polyolefinic synthetic pulp should be within the range of 5 to 50% by weight.

The alkali metal halide which is used in the present invention includes lithium chloride, sodium chloride, potassium chloride and the like. Sodium chloride is particularly effective. When the content of the alkali metal halide exceeds 2%, the slip sheet is satisfactory from the viewpoint of antistatic property because it generates little static electricity. In such case, however, from the viewpoint of manufacturing process, it offers some problem during conveyance because corona discharge or similar treatment which is conducted to improve the fast-contacting property of the slip sheet fails to provide the slip sheet with sufficient electrification. A slip sheet containing less than 0.2% of an alkali metal halide is not improved in antistatic property in any way, resulting in a poor workability of the slip sheet, although such slip sheet offers no problem with respect to conveyance property. Therefore, in order to satisfy all the requirements for slip sheets, the content of alkali metal halide should be within the range of 0.2 to 2% by weight.

The slip sheets for photosensitive lithographic printing plate materials according to this invention may be prepared by adding an olefinic synthetic pulp and an alkali metal halide to a stock or stuff followed by sheet making. Alternatively, only a polyolefinic synthetic pulp may be added to a stock or stuff. The mixture is then passed to sheet making process and the resulting paper is impregnated with a solution of an alkali metal halide.

The photosensitive printing plate material to which the present invention is applied may be lithographic plate material comprising a metal base such as aluminum, iron, zinc or magnesium base.

Among various PS plates, those in which the photosensitive layers contain a quinonediazide group as a sensitive group (e.g., see T. Tsunoda, "Photopolymers", Japan Printing Society (1972), p.p. 74–77) are particularly preferred.

Having generally described the invention, a further understanding can be obtained by reference to certain specific examples which are provided herein for purpose of illustration only and are not intended to be limiting unless otherwise specified.

In the examples, all the percentages and parts are by weight.

EXAMPLE 1

A stock consisting of 30 parts each of bleached pulps NBKP and LBKP was beaten to 50SR and 40 parts of polyethylene pulp which has previously been dispersed was added. The blend was then passed to a Fourdrinier paper machine to make a sheet, which was then impregnated with aqueous 0.5% solution of sodium chloride using a size press and dried at 90° to 110° C. to give slip sheets weighing 50 g/m$^2$.

The slip sheet contained 0.2 g/m$^2$ (0.4%) of sodium chloride.

The photosensitive lithographic printing plate to which the slip sheet was applied was a PS plate prepared by coating a grained and anodized aluminum plate with a sensitizing solution which consists of 5 parts of 1,2-naphthoquinonediazide-5-sulfonate ester of a phenol-formaldehyde novolak-type resin (containing 20 mol % of phenol), 10 parts of novolak-type phenol resin, 0.2 part of Dye BOH (C. I. basic blue-7) and 100 parts of ethyl cellosolve. The PS plate and the slip sheet were contacted tightly and tested for cutting, fast-contacting, release and electrification properties. The conditions for the tests and the results are summarized in Table 1 below.

In Table 1 are included also the results obtained with the slip sheets of the following examples and comparative examples when they were tightly contacted with similar PS plates and tested in the same way.

EXAMPLE 2

A slip sheet having a weight of 50 g/m$^2$ was obtained in the same manner as described in Example 1 except that the amount of polyethylene pulp used was 10.6 parts (15%) and that sodium chloride was replaced by potassium chloride. The slip sheet contained 0.25 g/m$^2$ (0.5%) of potassium chloride.

EXAMPLE 3

A slip sheet was made in the same manner as described in Example 1 except that the polyethylene pulp was replaced by 25.7 parts (30%) of polypropylene pulp.

COMPARATIVE EXAMPLE 1

A rosin size was added in an amount of 1 part as solids to 100 parts of the same stock as used in Example 1 and a sheet was made from the blend using a Fourdrinier machine. The sheet was then surface-sized with a wax dispersion (containing 2% as wax solids of a wax melting at 80° C.) on a size press to apply 15 ml/m$^2$ of the size to the sheet, and dried at 80° to 90° C. to obtain a slip sheet having a weight of 50 g/m$^2$.

COMPARATIVE EXAMPLE 2

To 100 parts of the same stock as used in Example 1 was added 3 parts of sodium stearate which had been diluted in 15 parts of warm water and dissolved therein by heating at 90° C. The mixture was then subjected to sheet making process and drying in the same manner as described in Example 1 to give a slip sheet having a weight of 50 g/m$^2$.

COMPARATIVE EXAMPLE 3

A slip sheet was made in the same manner as described in Example 1 except that neither polyethylene pulp nor sodium chloride was used.

COMPARATIVE EXAMPLE 4

A slip sheet was made in the same manner as described in Example 1 except that the amount of polyethylene pulp used was 140 parts (70%) and that no sodium chloride was used.

COMPARATIVE EXAMPLE 5

A slip sheet was made in the same manner as described in Example 1 except that the amount of polyethylene pulp used was 10.6 parts (15%) and that sodium chloride was used in the form of an aqueous 10% solution. The slip sheet contained 4 g/m$^2$ (8%) of sodium chloride.

COMPARATIVE EXAMPLE 6

A slip sheet was made in the same manner as described in Example 1 except that the amount of polyethylene pulp used was 10.6 parts (15%) and that an aqueous 0.13% sodium chloride solution was used for impregnation. The slip sheet contained 0.05 g/m² (0.1%) of sodium chloride.

COMPARATIVE EXAMPLE 7

A slip sheet was made in the same manner as described in Example 1 except that the amount of polyethylene pulp used was 1.2 parts (2%).

What is claimed as new and intended to be covered by Letters Patent is:

1. A photosensitive lithographic printing plate material comprising a photosensitive layer having a slip sheet laid on the surface thereof, said slip sheet comprising natural pulp, 5 to 50% by weight of polyolefinic synthetic pulp and 0.2 to 2.0% by weight of an alkali metal halide.

TABLE 1

Test Results

| | Polyolefinic synthetic pulp (content) | Alkali metal halide (content) | Cutting property*1 | Fast-contacting property*2 | Release property*3 | Electrification property*4 | | |
|---|---|---|---|---|---|---|---|---|
| | | | | | | Static electricity | Surface specific resistance | Charged voltage |
| | | | | | | | (Ω) | (V) |
| Example 1 | Polyethylene pulp (40%) | NaCl (0.4%) | (++) | (+) | (0) | (+) | 3.2 × 10¹⁰ | 135 |
| Example 2 | Polyethylene pulp (15%) | KCl (0.5%) | (++) | (+) | (+) | (+) | | |
| Example 3 | Polypropylene pulp (30%) | NaCl (0.4%) | (++) | (+) | (+) | (+) | | |
| Comp. Example 1 | — | — (contg. wax) | (+) | (+) | (+) | (−) | | |
| Comp. Example 2 | — | — (contg. sodium stearate) | (+) | (0) | (+) | (0) | | |
| Comp. Example 3 | — | — | (−) | (++) | (++) | (−) | 9.0 × 10¹¹ | 310 |
| Comp. Example 4 | Polyethylene pulp (70%) | — | (++) | (++) | (−) | (−) | | |
| Comp. Example 5 | Polyethylene pulp (15%) | NaCl (8%) | (++) | (−) | (++) | (++) | 1.0 × 10¹⁰ | 120 |
| Comp. Example 6 | Polyethylene pulp (15%) | NaCl (0.1%) | (++) | (+) | (+) | (−) | 3.8 × 10¹¹ | 260 |
| Comp. Example 7 | Polyethylene pulp (2%) | NaCl (0.4%) | (+) | (+) | (++) | (+) | | |

*¹Cutting property was evaluated by the maximum number of times of cuttings before the cutting area failed to keep a mirror surface condition.
*²The slip sheets were laminated to the aluminum PS plates and fast contacted by corona discharge. The laminates were then conveyed on a belt conveyor and piled up on a piler. During this procedure, the laminate was observed as to whether or not the slip sheet was shifted out of position, removed or crumpled to evaluate the fast-contacting property. The rating is as mentioned below.
*³The evaluation was made by tightly contacting the slip sheet with the aluminum PS plate and observing as to whether or not the slip sheet could be readily peeled off out of the plate and whether or not the photosensitive layer was damaged thereby. The rating is as mentioned below.
*⁴The static electrification property was tested by contacting tightly the slip sheet and the aluminum PS plate. The evaluation was made by the presence of absence of such phenomenon that the tester felt an electric shock due to generation of static electricity, heard a cracking noise owing to discharge or saw the emission of sparks. The surface specific resistance and charged voltage of the slip sheet were determined as basic physical properties under the following conditions:
Surface specific resistance (Ω): determined at a temperature of 27.5° C. and a relative humidity of 43%.
Charged voltage (V): determined by contacting tightly the slip sheet with the PS plate ("Sakura" positive-type SMP) and applying to the laminate a corona discharge of 6 KV using Kawaguchi Denki Electrostatic Paper Analyzer Model SP-428. The charged voltage is the maximum voltage of the thus charged laminate.
Rating:
(++) Very good
(+) Good
(0) Moderate
(−) Poor

Having now fully described this invention, it will be apparent to one of ordinary skill in the art that many changes and modifications can be made thereto without departing from the spirit or scope of the invention as set forth herein.

2. The photosensitive lithographic printing plate material as recited in claim 1 wherein said polyolefinic synthetic pulp is polyethylene pulp.

3. The photosensitive lithographic printing plate material as recited in claim 1 wherein said alkali metal halide is sodium chloride.

* * * * *